(12) United States Patent
Park (10) Patent No.: US 9,324,444 B2
(45) Date of Patent: Apr. 26, 2016

(54) DATA STORAGE DEVICE

(71) Applicant: SK hynix Inc., Icheon-si Gyeonggi-do (KR)

(72) Inventor: Seung Jin Park, Icheon-si (KR)

(73) Assignee: SK hynix Inc., Icheon-si (KR)

(*) Notice: Subject to any disclaimer, the term of this patent is extended or adjusted under 35 U.S.C. 154(b) by 141 days.

(21) Appl. No.: 14/092,486

(22) Filed: Nov. 27, 2013

(65) Prior Publication Data

US 2015/0049552 A1  Feb. 19, 2015

(30) Foreign Application Priority Data

Aug. 19, 2013  (KR) .................. 10-2013-0097803

(51) Int. Cl.
| | |
|---|---|
| *G11C 7/10* | (2006.01) |
| *G11C 16/30* | (2006.01) |
| *G11C 7/22* | (2006.01) |
| *G11C 5/14* | (2006.01) |
| *G06F 3/06* | (2006.01) |
| *G11C 16/32* | (2006.01) |
| *G06F 13/16* | (2006.01) |

(52) U.S. Cl.
CPC .............. *G11C 16/30* (2013.01); *G06F 3/0679* (2013.01); *G06F 13/1668* (2013.01); *G11C 5/143* (2013.01); *G11C 7/10* (2013.01); *G11C 7/222* (2013.01); *G11C 16/32* (2013.01); *Y02B 60/1228* (2013.01)

(58) Field of Classification Search
CPC ............ G11C 5/143; G11C 7/222; G11C 7/10
USPC .......................................................... 365/227
See application file for complete search history.

(56) References Cited

U.S. PATENT DOCUMENTS

| | | | | |
|---|---|---|---|---|
| 8,296,540 | B2 * | 10/2012 | Garlepp ............. | G06F 13/1689 365/211 |
| 2004/0057324 | A1 * | 3/2004 | Abe et al. ...................... | 365/232 |
| 2005/0276110 | A1 * | 12/2005 | Sakurai et al. ........... | 365/185.18 |
| 2009/0257289 | A1 * | 10/2009 | Byeon ...................... | 365/189.09 |
| 2011/0255329 | A1 * | 10/2011 | Kaku ............................ | 365/148 |
| 2012/0327726 | A1 * | 12/2012 | Tsern et al. .............. | 365/189.11 |

FOREIGN PATENT DOCUMENTS

KR  1020110004328 A  1/2011

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A data storage device includes a nonvolatile memory device; and a controller electrically coupled with the nonvolatile memory device, and configured to control an operation of the nonvolatile memory device, wherein the controller is configured to change a frequency of an internal clock and a level of an internal voltage, according to whether data is being transmitted through a channel.

19 Claims, 10 Drawing Sheets

DATA STORAGE DEVICE

CROSS-REFERENCES TO RELATED APPLICATION

The present application claims priority under 35 U.S.C. §119(a) to Korean application number 10-2013-0097803, filed on Aug. 19, 2013, in the Korean Intellectual Property Office, which is incorporated herein by reference in its entirety.

BACKGROUND

1. Technical Field

Various embodiments relate to a data storage device, and more particularly, to a data storage device which can control power consumption according to an operation state.

2. Related Art

Recently, the paradigm for the computer environment has been converted into ubiquitous computing so that computer systems can be used anytime and anywhere. Due to this fact, the use of portable electronic devices such as mobile phones, digital cameras, and notebook computers has rapidly increased. In general, such portable electronic devices use a data storage device which uses a memory device. The data storage device is used as a main memory device or an auxiliary memory device of a portable electronic device.

A data storage device using a memory device provides advantages in that, since there is no mechanical driving part, stability and durability are excellent, an information access speed is high and power consumption is small. Data storage devices having such advantages include a universal serial bus (USB) memory device, a memory card having various interfaces, and a solid state drive (SSD).

A data storage device may internally perform an operation in response to a request from a host device. The data storage device may perform a background operation when no request is made from the host device. Further, the data storage device may operate in an idle state or a power saving state when no request is made from the host device. In these ways, the data storage device may operate in various operation states, and power consumption in respective operation states may vary.

SUMMARY

A data storage device which can control power consumption is described herein.

In an embodiment of the present invention, a data storage device includes: a nonvolatile memory device; and a controller electrically coupled with the nonvolatile memory device, and configured to control an operation of the nonvolatile memory device, wherein the controller is configured to change a frequency of an internal clock and a level of an internal voltage, according to whether data is to be transmitted through a channel.

In an embodiment of the present invention, a data storage device includes: a nonvolatile memory device; and a controller configured to control an operation of the nonvolatile memory device according to a request from an external device, wherein the controller is configured to operate at any one of a low speed mode and a high speed mode according to an operating state of the nonvolatile memory device.

According to the embodiments of the present disclosure, because the frequency of an internal clock to be used and the level of an internal voltage to be used may be controlled according to an operation state, the power consumption of a data storage device may be reduced.

BRIEF DESCRIPTION OF THE DRAWINGS

Features, aspects, and embodiments are described in conjunction with the attached drawings, in which.

DETAILED DESCRIPTION

In the present invention, advantages, features and methods for achieving them will become more apparent after a reading of the following embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device according to the present disclosure will be described below with reference to the accompanying drawings through various embodiments.

Figure 1:
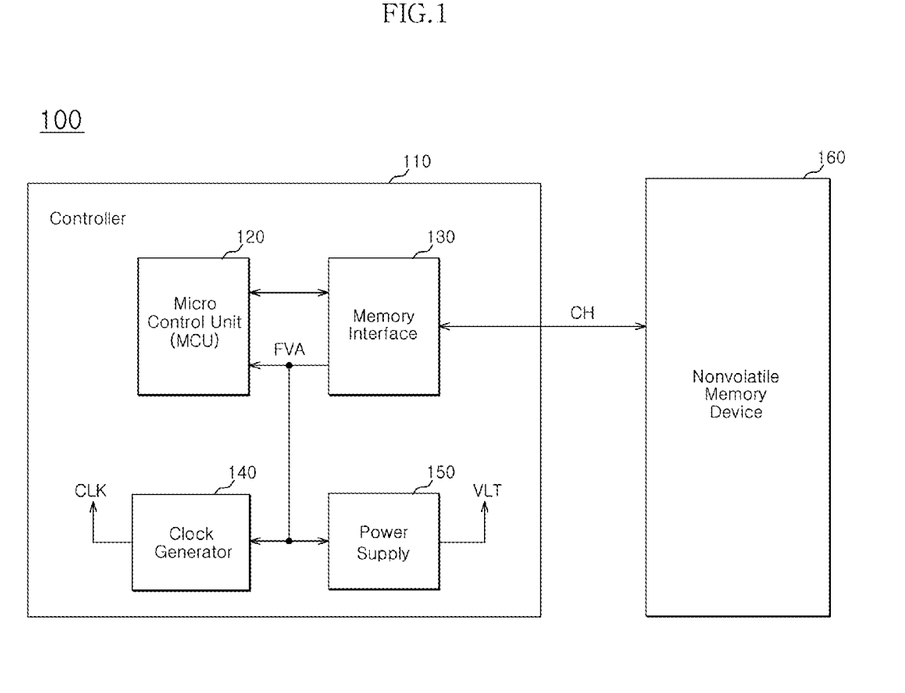
FIG. 1 is a block diagram exemplarily showing a data storage device in accordance with an embodiment of the present disclosure.
Figure 2:
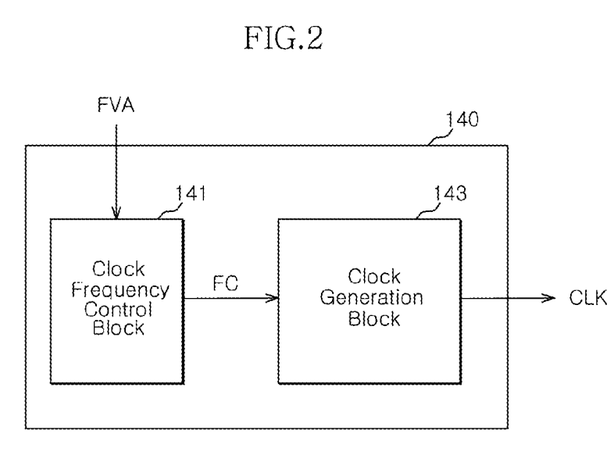
FIG. 2 is a block diagram exemplarily showing the clock generator shown in FIG. 1.
Figure 3:
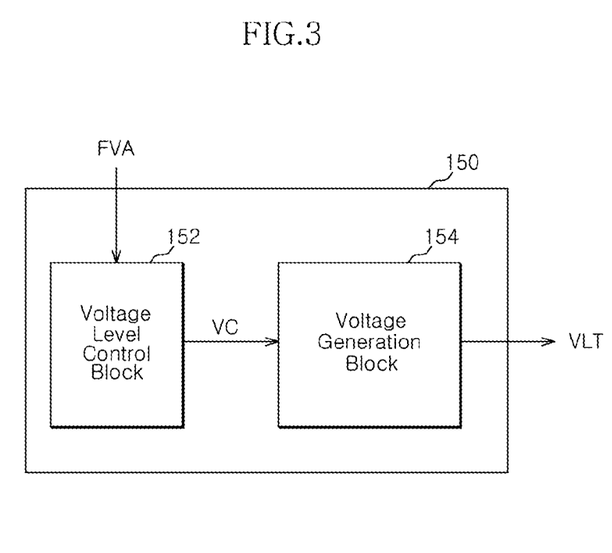
FIG. 3 is a block diagram exemplarily showing the power supply shown in FIG. 1.

FIG. 1 is a block diagram exemplarily showing a data storage device in accordance with an embodiment of the present disclosure. FIG. 2 is a block diagram exemplarily showing the clock generator shown in FIG. 1. FIG. 3 is a block diagram exemplarily showing the power supply shown in FIG. 1.

A data storage device 100 may be configured to operate in response to a request from a host device (not shown). The data storage device 100 may be configured to store data which are to be accessed by the host device. The data storage device 100 may also be referred to as a memory system. The data storage device 100 may be constituted by a memory card. The data storage device 100 may be constituted by a solid state drive (SSD). The data storage device 100 may be electrically coupled with the host device through various interfaces.

Referring to FIG. 1, the data storage device 100 may include a controller 110 and a nonvolatile memory device 160.

The controller 110 may be configured to control the nonvolatile memory device 160 in response to a request from the host device. For example, the controller 110 may be configured to provide the data read from the nonvolatile memory device 160, to the host device. In another example, the controller 110 may be configured to store the data provided from the host device, in the nonvolatile memory device 160. For these operations, the controller 110 may be configured to control the read, write (or program) and erase operations of the nonvolatile memory device 160. The controller 110 may be electrically coupled with the nonvolatile memory device 160 through a channel CH, and configured to control an operation of the nonvolatile memory device 160. In addition, the controller 110 may be configured to change a frequency of an output clock CLK to be used and a level of an internal voltage VLT to be used, according to whether data is to be transmitted through the channel CH.

The nonvolatile memory device 160 may operate as the storage medium of the data storage device 100. Herein below, the nonvolatile memory device 160 constituted by a NAND type flash memory device will be exemplified. However, it will be appreciated that the nonvolatile memory device 160 may be constituted by any one of various nonvolatile memory devices such as a NOR type flash memory device, a ferroelectric random access memory (FRAM) using ferroelectric capacitors, a magnetic random access memory (MRAM) using a tunneling magneto-resistive (TMR) layer, a phase change random access memory (PRAM) using a chalcogenide alloy, and a resistive random access memory (ReRAM) using a transition metal oxide. The nonvolatile memory device 160 may be constituted by a combination of a NAND type flash memory device and one or more of the various types of nonvolatile memory devices described above.

The controller 110 may be configured to drive a firmware or software for controlling the general operations of the data storage device 100. The nonvolatile memory device 160 may perform a read or program operation by the unit of a page due to a structural characteristic thereof. Further, the nonvolatile memory device 160 may perform an erase operation by the unit of a block due to a structural characteristic thereof. The nonvolatile memory device 160 may not perform an overwrite operation due to a structural characteristic thereof. Because of these characteristics of the nonvolatile memory device 160, the controller 110 may be configured to drive an additional firmware or software which is called a flash translation layer (FTL).

The controller 110 may include a micro control unit 120, a memory interface 130, a clock generator 140, and a power supply 150. Although not shown, the controller 110 may further include function blocks such as a host interface, a working memory device and an error correction code (ECC) unit.

The micro control unit 120 may be configured to control the general operations of the controller 110 through driving of a firmware or software which is loaded on a working memory device (not shown).

The memory interface 130 may be configured to interface the controller 110 and the nonvolatile memory device 160. The memory interface 130 may be configured to control the nonvolatile memory device 160 under the control of the micro control unit 120. For example, the memory interface 130 may be configured to provide control signals for controlling the nonvolatile memory device 160, to the nonvolatile memory device 160; and activate or deactivate a frequency voltage control signal FVA according to whether data is being transmitted through the channel CH. According to the control signals provided through the memory interface 130, commands and addresses may be provided to the nonvolatile memory device 160. The memory interface 130 may be configured to exchange data with the nonvolatile memory device 160. The memory interface 130 may provide control signals to and exchange data with the nonvolatile memory device 160, through a channel CH.

The memory interface 130 may be configured to generate a frequency voltage control signal FVA for dynamically controlling the operating clock and the operating voltage of the controller 110 according to the operating state of the nonvolatile memory device 160. For example, the memory interface 130 may generate the control signal FVA while controlling the read or write operation of the nonvolatile memory device 160. In another example, the memory interface 130 may generate the control signal FVA while controlling data to be transmitted through the channel CH. That is to say, the memory interface 130 may generate the control signal FVA while controlling data to be transmitted from the nonvolatile memory device 160. The memory interface 130 may generate the control signal FVA while controlling data to be transmitted to the nonvolatile memory device 160.

The control signal FVA generated by the memory interface 130 may be provided to the micro control unit 120, the clock generator 140, and the power supply 150. The micro control unit 120 may determine the operating state of the data storage device 100 on the basis of the provided control signal FVA. The clock generator 140 may dynamically perform a clock generating operation in response to the provided control signal FVA. The power supply 150 may dynamically perform a power generating operation in response to the provided control signal FVA. The power supply 150 may be configured to generate the internal voltage VLT, wherein the level of the internal voltage VLT may be changed according to the control signal FVA.

The clock generator 140 may be configured to generate a clock CLK which is to be used in the controller 110. The clock CLK generated by the clock generator 140 may be used as the operating clock of the function blocks (for example, the micro control unit 120 and the memory interface 130) included in the controller 110. The clock generator 140 may change the frequency or the cycle of the output clock CLK according to the control signal FVA provided from the memory interface 130.

Referring to FIG. 2, the clock generator 140 may include a clock frequency control block 141 and a clock generation block 143. The clock frequency control block 141 may be configured to control the clock generation block 143. The clock generation block 143 may be configured to generate the output clock CLK with various frequencies according to a control signal FC which is provided from the clock frequency control block 141.

The clock frequency control block 141 may control the clock generation block 143 in such a manner that the frequency or the cycle of the output clock CLK may be changed in response to the control signal FVA provided from the memory interface 130. For example, the clock frequency control block 141 may control the clock generation block 143 in such a manner that the output clock CLK with a high frequency, that is, the output clock CLK with a short cycle, is generated when the activated control signal FVA is provided from the memory interface 130. In another example, the clock frequency control block 141 may control the clock generation block 143 in such a manner that the output clock CLK with a low frequency, that is, the output clock CLK with a long cycle, is generated when the deactivated control signal FVA is provided from the memory interface 130.

The power supply 150 may be configured to generate power which is to be used in the controller 110 and power which is to be provided to the nonvolatile memory device 160. The power (for example, the voltage VLT) generated by the power supply 150 may be used as the operating power of the function blocks (for example, the micro control unit 120 and the memory interface 130) included in the controller 110. The power supply 150 may change the level of the output voltage VLT according to the control signal FVA which is provided from the memory interface 130.

Referring to FIG. 3, the power supply 150 may include a voltage level control block 152 and a voltage generation block 154. The voltage level control block 152 may be configured to control the voltage generation block 154. The voltage generation block 154 may be configured to generate the output voltage VLT with various levels according to a control signal VC which is provided from the voltage level control block 152.

The voltage level control block 152 may control the voltage generation block 154 in such a manner that the level of the output voltage VLT may be changed in response to the control signal FVA provided from the memory interface 130. For example, the voltage level control block 152 may control the voltage generation block 154 in such a manner that the output voltage VLT with a high level is generated when the activated control signal FVA is provided from the memory interface 130. In another example, the voltage level control block 152 may control the voltage generation block 154 in such a manner that the output voltage VLT with a low level is generated when the deactivated control signal FVA is provided from the memory interface 130.

Figure 4:
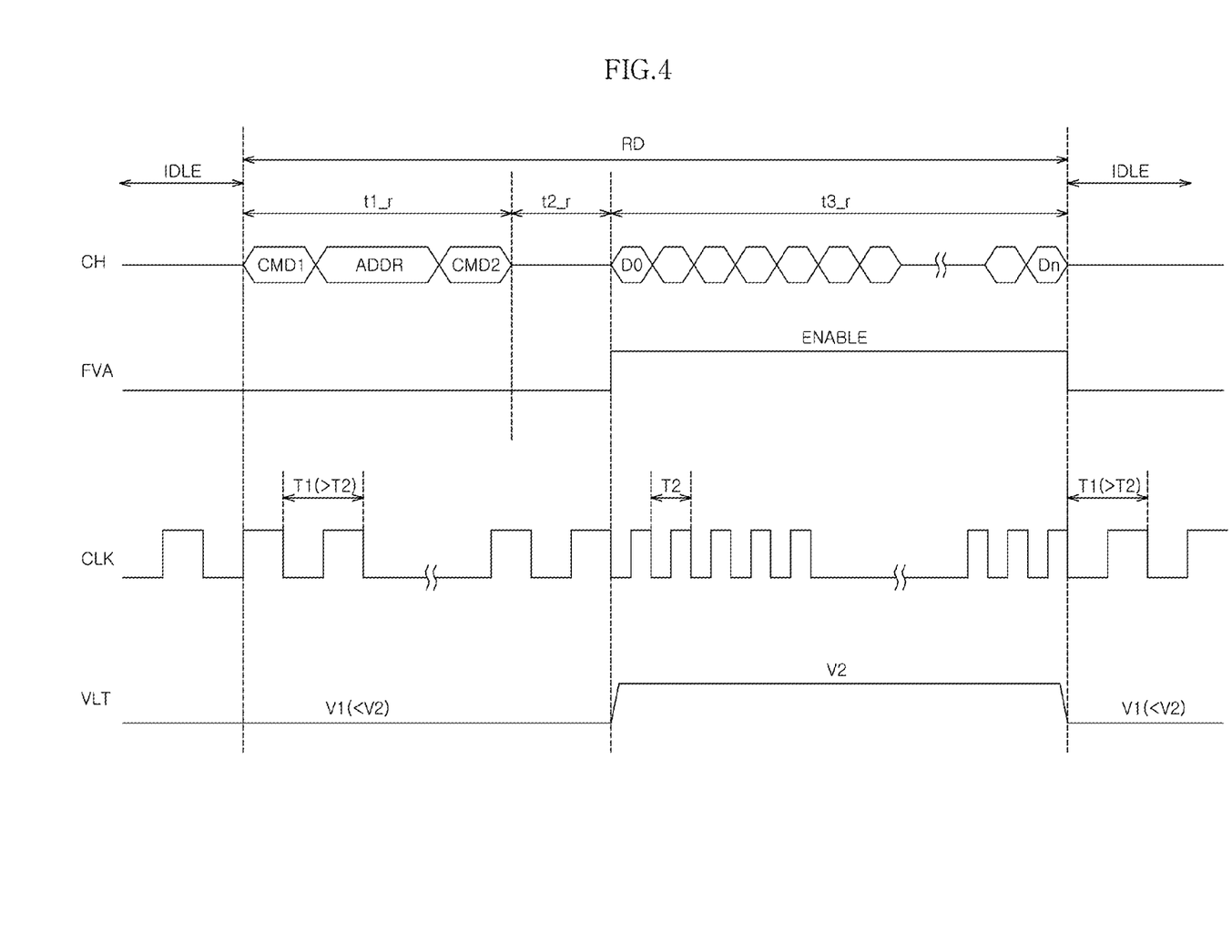
FIG. 4 is a timing diagram exemplarily explaining clock and voltage control operations during the read operation of the data storage device in accordance with an embodiment of the present disclosure.

FIG. 4 is a timing diagram exemplarily explaining clock and voltage control operations during the read operation of the data storage device in accordance with an embodiment of the present disclosure. Referring to FIG. 4, there are shown an idle period IDLE in which the nonvolatile memory device 160 does not perform any operation and a read period RD in which the nonvolatile memory device 160 performs a read operation.

The control signal FVA for dynamically controlling the operating clock and the operating voltage of the controller 110 may be activated (enabled) or deactivated (disabled) according to the operating state of the nonvolatile memory device 160. For example, the control signal FVA may be activated during the read period RD in which the nonvolatile memory device 160 performs the read operation. The control signal FVA may be deactivated during the idle period IDLE in which the nonvolatile memory device 160 does not perform any operation.

The control signal FVA for dynamically controlling the operating clock and the operating voltage of the controller 110 may be activated for a period t3_r in which data D0 to Dn are transmitted through the channel CH, even in the read period RD. In other words, the control signal FVA may be activated while the memory interface 130 operates fast for transmission of the data D0 to Dn. The control signal FVA may be deactivated for the remaining period excluding the period t3_r in which data are transmitted through the channel CH, for example, for a period t1_r for controlling or setting the read operation and a period t2_r in which data are sensed from memory cells.

During the period in which the control signal FVA is deactivated, the frequency of the clock CLK outputted from the clock generator 140 may be low. Namely, a cycle T1 of the clock CLK when outputted during the period in which the control signal FVA is deactivated may be longer than a cycle T2 of CLK when outputted during the period in which the control signal FVA is activated. Conversely, during the period in which the control signal FVA is activated, the frequency of the clock CLK outputted from the clock generator 140 may be high. Namely, the cycle T2 of the clock CLK when outputted during the period in which the control signal FVA is activated may be shorter than the cycle T1 of CLK when outputted during the period in which the control signal FVA is deactivated.

For instance, the cycle T2 of the clock CLK outputted during the period in which the control signal FVA is activated may be the same as the cycle of a clock which is necessary when the controller 110 operates in a normal mode or a high speed mode. The cycle T1 of the clock CLK outputted during the period in which the control signal FVA is deactivated may be the same as the cycle of a clock which is necessary when the controller 110 operates in a power save mode or a low speed mode. The controller 110 may be configured to operate at the high speed mode when the nonvolatile memory device 160 performs a read or write operation.

During the period in which the control signal FVA is deactivated, the level of the voltage VLT outputted from the power supply 150 may be low. Namely, a level V1 of the voltage VLT outputted during the period in which the control signal FVA is deactivated may be lower than a level V2 of the voltage VLT outputted during the period in which the control signal FVA is activated. Conversely, during the period in which the control signal FVA is activated, the level of the voltage VLT outputted from the power supply 150 may be high. Namely, the level V2 of the voltage VLT outputted during the period in which the control signal FVA is activated may be higher than the level V1 of the voltage VLT outputted during the period in which the control signal FVA is deactivated.

For instance, the level V2 of the voltage VLT outputted during the period in which the control signal FVA is activated may be the same as the level of a voltage which is necessary when the controller 110 operates in the normal mode or the high speed mode. The level V1 of the voltage VLT outputted during the period in which the control signal FVA is deactivated may be the same as the level of a voltage which is necessary when the controller 110 operates in the power save mode or the low speed mode.

Through these operations, because a clock with a high frequency and a voltage with a high level are used for a period in which data are transmitted from the nonvolatile memory device 160 to the controller 110, the controller 110 may perform a high speed operation. Also, because a clock with a low frequency and a voltage with a low level are used for a period in which data are not transmitted, the controller 110 may reduce power consumption.

Figure 5:
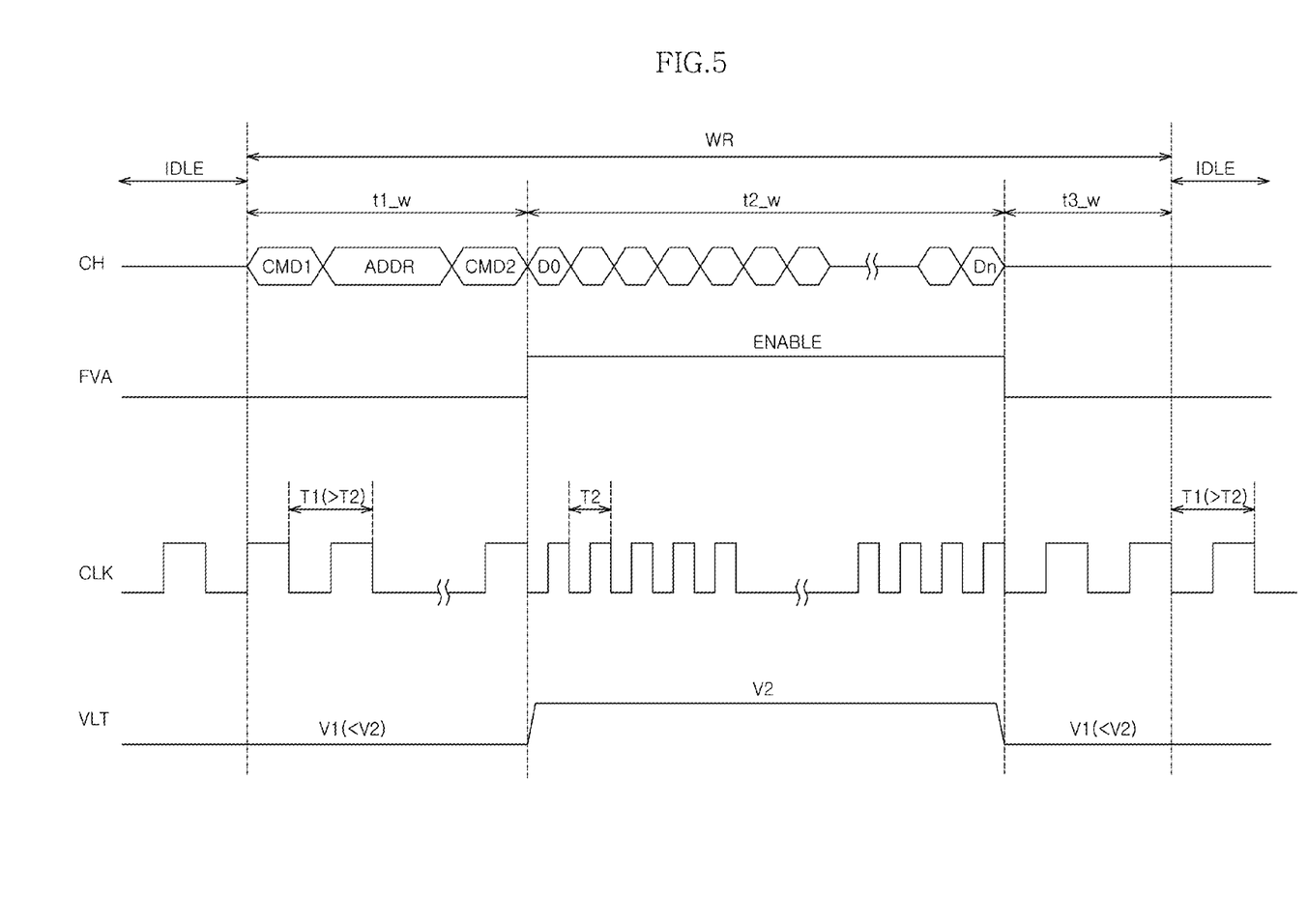
FIG. 5 is a timing diagram exemplarily explaining clock and voltage control operations during the write operation of the data storage device in accordance with an embodiment of the present disclosure.

FIG. 5 is a timing diagram exemplarily explaining clock and voltage control operations during the write operation of the data storage device in accordance with an embodiment of the present disclosure. Referring to FIG. 5, there are shown an idle period IDLE in which the nonvolatile memory device 160 does not perform any operation and a write period WR in which the nonvolatile memory device 160 performs a write operation.

The control signal FVA for dynamically controlling the operating clock and the operating voltage of the controller 110 may be activated (enabled) or deactivated (disabled) according to the operating state of the nonvolatile memory device 160. For example, the control signal FVA may be activated during the write period WR in which the nonvolatile memory device 160 performs the write operation. The control signal FVA may be deactivated during the idle period IDLE in which the nonvolatile memory device 160 does not perform any operation.

The control signal FVA for dynamically controlling the operating clock and the operating voltage of the controller 110 may be activated for a period t2_w in which data D0 to Dn are transmitted through the channel CH, even in the write period WR. In other words, the control signal FVA may be activated while the memory interface 130 operates fast for transmission of the data D0 to Dn. The control signal FVA may be deactivated for the remaining period excluding the period t2_w in which data are transmitted through the channel CH, for example, for a period t1_w for controlling or setting the write operation and a period t3_w in which data are written to memory cells.

During the period in which the control signal FVA is deactivated, the frequency of the clock CLK outputted from the clock generator 140 may be low. Namely, a cycle T1 of the clock CLK outputted during the period in which the control signal FVA is deactivated may be longer than a cycle T2 of the clock CLK outputted during the period in which the control signal FVA is activated. Conversely, during the period in which the control signal FVA is activated, the frequency of the clock CLK outputted from the clock generator 140 may be high. Namely, the cycle T2 of the clock CLK outputted during the period in which the control signal FVA is activated may be shorter than the cycle T1 of the clock CLK outputted during the period in which the control signal FVA is deactivated.

For instance, the cycle T2 of the clock CLK outputted during the period in which the control signal FVA is activated may be the same as the cycle of a clock which is necessary when the controller 110 operates in a normal mode or a high speed mode. The cycle T1 of the clock CLK outputted during the period in which the control signal FVA is deactivated may be the same as the cycle of a clock which is necessary when the controller 110 operates in a power save mode or a low speed mode.

During the period in which the control signal FVA is deactivated, the level of the voltage VLT outputted from the power supply 150 may be low. Namely, a level V1 of the voltage VLT outputted during the period in which the control signal FVA is deactivated may be lower than a level V2 of the voltage VLT outputted during the period in which the control signal FVA is activated. Conversely, during the period in which the control signal FVA is activated, the level of the voltage VLT outputted from the power supply 150 may be high. Namely, the level V2 of the voltage VLT outputted during the period in which the control signal FVA is activated may be higher than the level V1 of the voltage VLT outputted during the period in which the control signal FVA is deactivated.

For instance, the level V2 of the voltage VLT outputted during the period in which the control signal FVA is activated may be the same as the level of a voltage which is necessary when the controller 110 operates in the normal mode or the high speed mode. The level V1 of the voltage VLT outputted during the period in which the control signal FVA is deactivated may be the same as the level of a voltage which is necessary when the controller 110 operates in the power save mode or the low speed mode.

Through these operations, because a clock with a high frequency and a voltage with a high level are used for a period in which data are transmitted from the controller 110 to the nonvolatile memory device 160, the controller 110 may perform a high speed operation. Also, because a clock with a low frequency and a voltage with a low level are used for a period in which data are not transmitted, the controller 110 may reduce power consumption. Accordingly, the controller 110 may be configured to operate at any one of a low speed mode and a high speed mode according to an operating state of the nonvolatile memory device 160.

Figure 6:
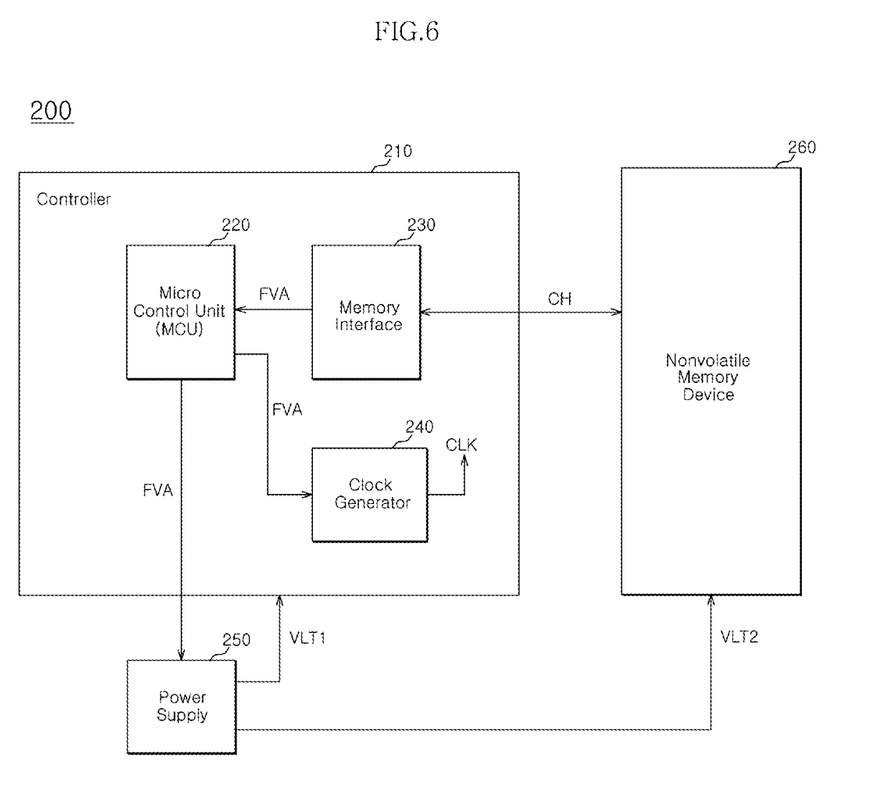
FIG. 6 is a block diagram exemplarily showing a data storage device in accordance with an embodiment of the present disclosure.

FIG. 6 is a block diagram exemplarily showing a data storage device in accordance with an embodiment of the present disclosure.

A data storage device 200 may be configured to operate in response to a request from a host device (not shown). The data storage device 200 may be configured to store data which are to be accessed by the host device. The data storage device 200 may also be referred to as a memory system. The data storage device 200 may be constituted by a memory card. The data storage device 200 may be constituted by a solid state drive (SSD). The data storage device 200 may be electrically coupled with the host device through various interfaces.

Referring to FIG. 6, the data storage device 200 may include a controller 210, a power supply 250, and a nonvolatile memory device 260.

The controller 210 may be configured to control the nonvolatile memory device 260 in response to a request from the host device. For example, the controller 210 may be configured to provide the data read from the nonvolatile memory device 260, to the host device. In another example, the controller 210 may be configured to store the data provided from the host device, in the nonvolatile memory device 260. For these operations, the controller 210 may be configured to control the read, write (or program) and erase operations of the nonvolatile memory device 260.

The nonvolatile memory device 260 may operate as the storage medium of the data storage device 200. Herein below, the nonvolatile memory device 260 constituted by a NAND type flash memory device will be exemplified. However, it will be appreciated that the nonvolatile memory device 260 may be constituted by any one of various nonvolatile memory devices such as a NOR type flash memory device, a ferroelectric RAM (FRAM) using ferroelectric capacitors, a magnetic RAM (MRAM) using a tunneling magneto-resistive (TMR) layer, a phase change memory device (PRAM) using a chalcogenide alloy, and a resistive memory device (ReRAM) using a transition metal oxide.

The controller 210 may be configured to drive a firmware or software for controlling the general operations of the data storage device 200. The nonvolatile memory device 260 may perform a read or program operation by the unit of a page due to a structural characteristic thereof. Further, the nonvolatile memory device 260 may perform an erase operation by the unit of a block due to a structural characteristic thereof. The nonvolatile memory device 260 may not perform an overwrite operation due to a structural characteristic thereof. Because of these characteristics of the nonvolatile memory device 260, the controller 210 may be configured to drive an additional firmware or software which is called a flash translation layer (FTL).

The controller 210 may include a micro control unit 220, a memory interface 230, and a clock generator 240. Although not shown, the controller 210 may further include function blocks such as a host interface, a working memory device and an error correction code (ECC) unit.

The micro control unit 220 may be configured to control the general operations of the controller 210 through driving of a firmware or software which is loaded on a working memory device (not shown).

The memory interface 230 may be configured to interface the controller 210 and the nonvolatile memory device 260. The memory interface 230 may be configured to control the nonvolatile memory device 260 under the control of the micro control unit 220. For example, the memory interface 230 may be configured to provide control signals for controlling the nonvolatile memory device 260, to the nonvolatile memory device 260. According to the control signals provided through the memory interface 230, commands and addresses may be provided to the nonvolatile memory device 260. The memory interface 230 may be configured to exchange data with the nonvolatile memory device 260. The memory interface 230 may provide control signals to and exchange data with the nonvolatile memory device 260, through a channel CH.

The memory interface 230 may be configured to generate a control signal FVA for dynamically controlling the operating clock and the operating voltage of the controller 210 according to the operating state of the nonvolatile memory device 260. For example, the memory interface 230 may generate the control signal FVA while controlling the read or write operation of the nonvolatile memory device 260. In another example, the memory interface 230 may generate the control signal FVA while controlling data to be transmitted through the channel CH. That is to say, the memory interface 230 may generate the control signal FVA while controlling data to be transmitted from the nonvolatile memory device 260. The memory interface 230 may generate the control signal FVA while controlling data to be transmitted to the nonvolatile memory device 260. The control signal FVA generated by the memory interface 230 may be provided to the micro control unit 220.

The clock generator 240 may be configured to generate a clock CLK which is to be used in the controller 210. The clock CLK generated by the clock generator 240 may be used as the operating clock of the function blocks (for example, the micro control unit 220 and the memory interface 230) included in the controller 210. The clock generator 240 may change the frequency or the cycle of the output clock CLK according to the control signal FVA provided from the micro control unit 220.

The configuration and operations of the clock generator 240 may be the same as the configuration and operations of the clock generator 140 of FIG. 1. For example, the clock generator 240 may generate the output clock CLK with a high frequency, that is, the output clock CLK with a short cycle, when the activated control signal FVA is provided. In another example, the clock generator 240 may generate the output clock CLK with a low frequency, that is, the output clock CLK with a long cycle, when the deactivated control signal FVA is provided.

The power supply 250 may be configured to generate power which is to be used in the data storage device 200. For example, the power supply 250 may be configured to generate power (for example, a voltage VLT1) which is to be provided to the controller 210 and power (for example, a voltage VLT2) which is to be provided to the nonvolatile memory device 260. The power supply 250 may change the level of the output voltage VLT1 which is to be provided to the controller 210, according to the control signal FVA which is provided from the micro control unit 220.

The configuration and operations of the power supply 250 may be the same as the configuration and operations of the power supply 250 of FIG. 1. For example, the power supply 250 may generate the output voltage VLT1 with a high level when the activated control signal FVA is provided. In another example, the power supply 250 may generate the output voltage VLT1 with a low level when the deactivated control signal FVA is provided.

Similarly to the data storage device 100 of FIG. 1, in the data storage device 200, since the operating clock CLK and the operating voltage VLT1 to be used in the controller 210 may be dynamically controlled in response to the control signal FVA provided from the memory interface 230, the power consumption of the controller 210 may be reduced.

Figure 7:
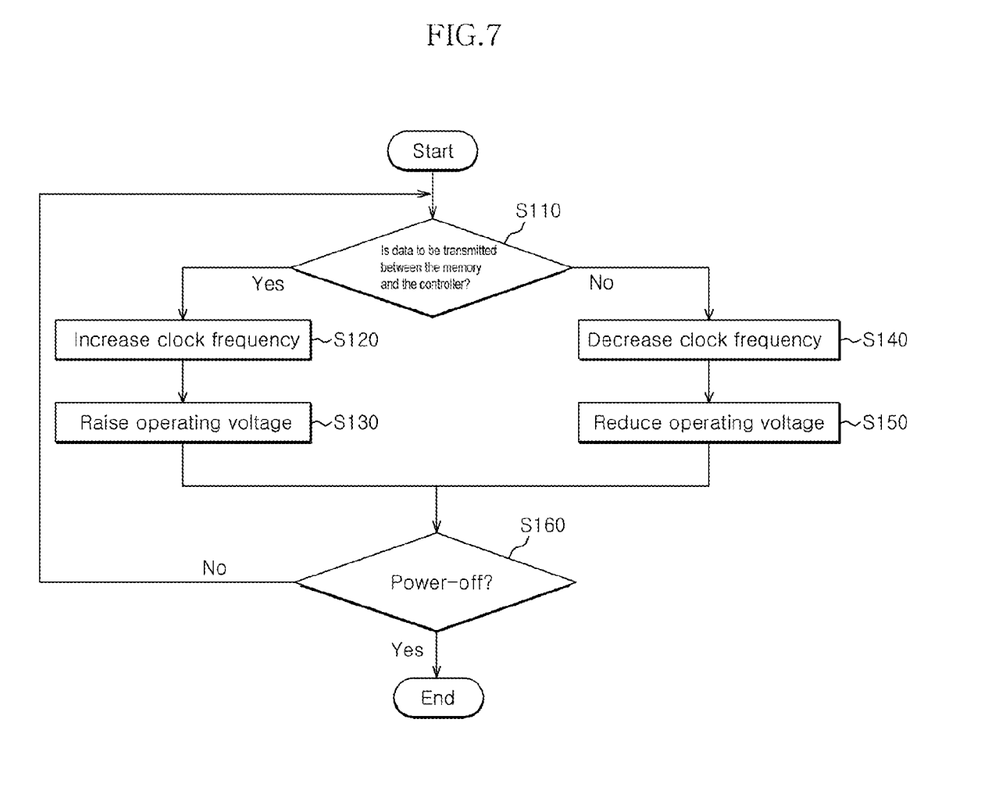
FIG. 7 is a flow chart explaining operations of the data storage device in accordance with the embodiments of the present disclosure.

FIG. 7 is a flow chart explaining operations of the data storage device in accordance with the embodiments of the present disclosure. The clock and voltage controlling operations of each of the controllers included in the data storage device 100 of FIG. 1 and the data storage device 200 of FIG. 6 will be described below with reference to FIG. 7.

In step S110, whether a nonvolatile memory device of a data storage device operates, wherein data is being read or written, or not may be determined. For example, whether or not data transmission is being implemented between the nonvolatile memory device and the controller may be determined. That is to say, whether or not data to be stored in the nonvolatile memory device or data to be read from the nonvolatile memory device are to be transmitted through a channel may be determined.

In the case where it is determined that the nonvolatile memory device operates (in the case of Yes), the controller may operate in a normal mode or a high speed mode. In this case, as in step S120, the frequency of a clock which is necessary for the operation of the controller may be increased. Further, as in step S130, an operating voltage which is necessary for the operation of the controller may be raised.

In the case where it is determined that the nonvolatile memory device does not operate (in the case of No), the controller may operate in a power save mode or a low speed mode. The controller may be configured to operate at the low speed mode while the nonvolatile memory device performs an operation other than a read or write operation. In this case, as in step S140, the frequency of a clock which is necessary for the operation of the controller may be decreased. Further, as in step S150, an operating voltage which is necessary for the operation of the controller may be reduced.

In step S160, the operations of controlling the clock and the voltage of the controller according to the operating state of the nonvolatile memory device may be continuously performed until the data storage device is powered off.

Figure 8:
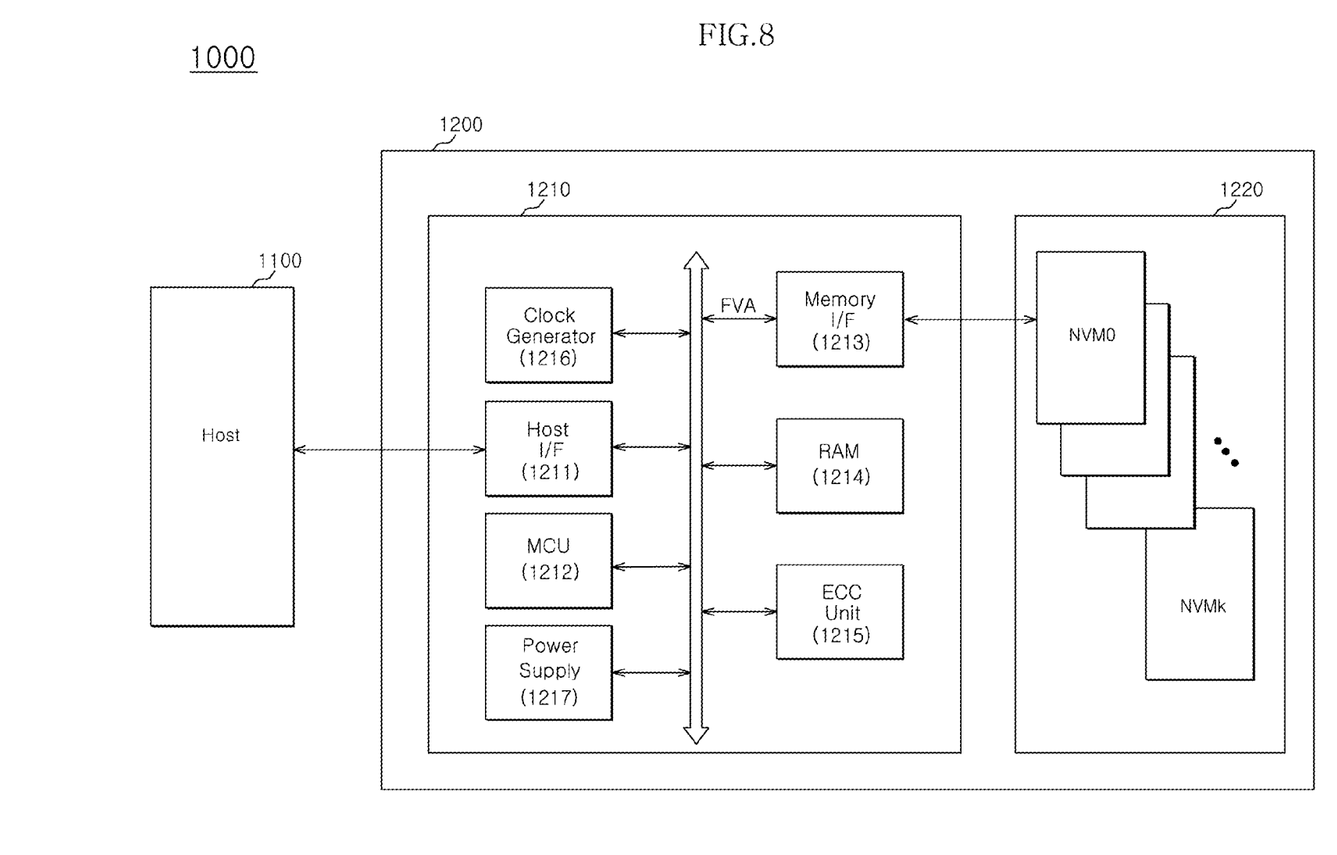
FIG. 8 is a block diagram exemplarily showing a data processing system including a data storage device in accordance with an embodiment of the present disclosure.

FIG. 8 is a block diagram exemplarily showing a data processing system including a data storage device in accordance with an embodiment of the present disclosure. Referring to FIG. 8, a data processing system 1000 may include a host device 1100 and a data storage device 1200.

The data storage device 1200 may include a controller 1210 and a nonvolatile memory device 1220. The data storage device 1200 may be used by being electrically coupled to the host device 1100 such as a desktop computer, a notebook computer, a digital camera, a mobile phone, an MP3 player, a game player, and so forth. The data storage device 1200 is also referred to as a memory system.

The controller 1210 may be configured to access the nonvolatile memory device 1220 in response to a request from the host device 1100. For example, the controller 1210 may be configured to control the read, program or erase operation of the nonvolatile memory device 1220. The controller 1210 may be configured to drive a firmware or software for controlling the nonvolatile memory device 1220.

The controller 1210 may include a host interface 1211, a micro control unit 1212, a memory interface 1213, a RAM 1214, an error correction code unit 1215, a clock generator 1216, and a power supply 1217.

The micro control unit 1212 may be configured to control the general operations of the controller 1210 in response to a request from the host device 1100. The RAM 1214 may be used as a working memory of the micro control unit 1212. The RAM 1214 may temporarily store the data read from the nonvolatile memory device 1220 or the data provided from the host device 1100.

The host interface 1211 may be configured to interface the host device 1100 and the controller 1210. For example, the host interface 1211 may be configured to communicate with the host device 1100 through one of various interface protocols such as an universal serial bus (USB) protocol, an universal flash storage (UFS) protocol, a multimedia card (MMC) protocol, a peripheral component interconnection (PCI) protocol, a PCI-express (PCI-E) protocol, a parallel advanced technology attachment (PATA) protocol, a serial advanced technology attachment (SATA) protocol, a small computer system interface (SCSI) protocol, a serial attached SCSI (SAS) protocol, and an IDE (integrated drive electronics) protocol.

The memory interface 1213 may be configured to interface the controller 1210 and the nonvolatile memory device 1220. The memory interface 1213 may be configured to provide a command and an address to the nonvolatile memory device 1220. Furthermore, the memory interface 1213 may be configured to exchange data with the nonvolatile memory device 1220. The memory interface 1213 may be configured to generate a control signal FVA for dynamically controlling the operating clock and the operating voltage of the controller 1210 according to an operating state of the nonvolatile memory device 1220. For example, the memory interface 1213 may generate the control signal FVA while controlling the read or write operation of the nonvolatile memory device 1220. In another example, the memory interface 1213 may generate the control signal FVA while controlling data to be transmitted through channels.

The error correction code unit 1215 may be configured to detect an error of the data read from the nonvolatile memory device 1220. Also, the error correction code unit 1215 may be configured to correct the detected error when the detected error falls within a correctable range. The error correction code unit 1215 may be provided inside or outside the controller 1210 according to the memory system 1000.

The clock generator 1216 may be configured to generate a clock to be used in the controller 1210. The clock generated by the clock generator 1216 may be used as the operating clock of the function blocks (for example, the host interface 1211, the micro control unit 1212, the memory interface 1213 and the error correction code unit 1215) included in the controller 1210. The clock generator 1216 may change the frequency or the cycle of an output clock according to the control signal FVA which is provided from the memory interface 1213. For example, the clock generator 1216 may generate an output clock with a high frequency, that is, an output clock with a short cycle, when the activated control signal FVA is provided. In another example, the clock generator 1216 may generate an output clock with a low frequency, that is, an output clock with a long cycle, when the deactivated control signal FVA is provided.

The power supply 1217 may be configured to generate power to be used in the controller 1210 and power to be provided to the nonvolatile memory device 1220. The power generated by the power supply 1217 may be used as operating power of the function blocks (for example, the host interface 1211, the micro control unit 1212, the memory interface 1213 and the error correction code unit 1215) included in the controller 1210. The power supply 1217 may change the level of an output voltage according to the control signal FVA which is provided from the memory interface 1213. For example, the power supply 1217 may generate an output voltage with a high level when the activated control signal FVA is provided. In another example, the power supply 1217 may generate an output voltage with a low level when the deactivated control signal FVA is provided.

Because the operating clock and the operating voltage to be used in the controller 1210 may be dynamically controlled in response to the control signal FVA which is provided from the memory interface 1213, the controller 1210 may reduce power consumption.

The controller 1210 and the nonvolatile memory device 1220 may be integrated into one semiconductor apparatus and may be configured as a memory device. For example, the controller 1210 and the nonvolatile memory device 1220 may be integrated into one semiconductor apparatus and may be configured as a personal computer memory card international association (PCMCIA) card, a compact flash (CF) card, a smart media card, a memory stick, a multimedia card (such as MMC, RS-MMC and MMC-micro cards), a secure digital (SD) card (such as SD, Mini-SD and Micro-SD cards), an universal flash storage (UFS) device, etc.

Figure 9:
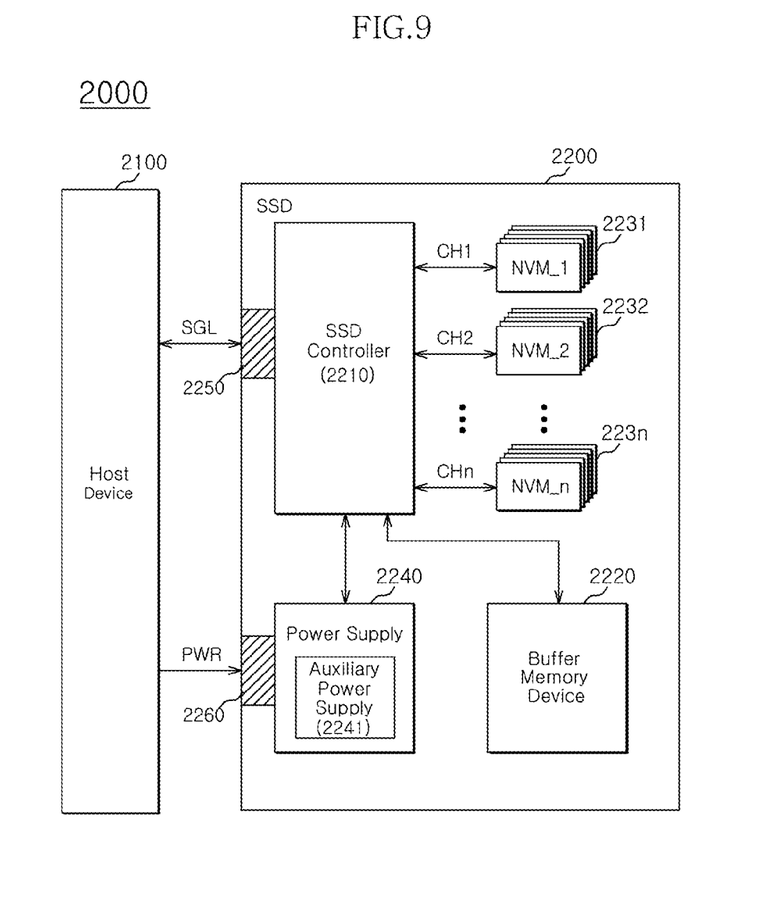
FIG. 9 is a block diagram exemplarily showing a data processing system including a solid state drive (SSD) in accordance with an embodiment of the present disclosure.

FIG. 9 is a block diagram exemplarily showing a data processing system including a solid state drive (SSD) in accordance with an embodiment of the present disclosure. Referring to FIG. 9, a data processing system 2000 may include a host device 2100 and an SSD 2200.

The SSD 2200 may include an SSD controller 2210, a buffer memory device 2220, nonvolatile memory devices 2231 to 223n, a power supply 2240, a signal connector 2250, and a power connector 2260.

The SSD 2200 may operate in response to a request from the host device 2100. That is to say, the SSD controller 2210 may be configured to access the nonvolatile memory devices 2231 to 223n in response to a request from the host device 2100. For example, the SSD controller 2210 may be configured to control the read, program and erase operations of the nonvolatile memory devices 2231 to 223n.

The buffer memory device 2220 may be configured to temporarily store data which are to be stored in the nonvolatile memory devices 2231 to 223n. Further, the buffer memory device 2220 may be configured to temporarily store data which are read from the nonvolatile memory devices 2231 to 223n. The data temporarily stored in the buffer memory device 2220 may be transmitted to the host device 2100 or the nonvolatile memory devices 2231 to 223n under the control of the SSD controller 2210.

The nonvolatile memory devices 2231 to 223n may be used as storage media of the SSD 2200. The nonvolatile memory devices 2231 to 223n may be electrically coupled to the SSD controller 2210 through a plurality of channels CH1 to CHn, respectively. One or more nonvolatile memory devices may be electrically coupled to one channel. The nonvolatile memory devices electrically coupled to one channel may be electrically coupled to the same signal bus and data bus.

The power supply 2240 may be configured to provide power PWR inputted through the power connector 2260, to the inside of the SSD 2200. The power supply 2240 may include an auxiliary power supply 2241. The auxiliary power supply 2241 may be configured to supply power so as to allow the SSD 2200 to be normally terminated when a sudden power-off occurs. The auxiliary power supply 2241 may include super (large) capacitors capable of being charged with power PWR.

The SSD controller 2210 may exchange a signal SGL with the host device 2100 through the signal connector 2250. The signal SGL may include a command, an address, data, and so forth. The signal connector 2250 may by constituted by a connector such as of parallel advanced technology attachment (PATA), serial advanced technology attachment (SATA), small computer system interface (SCSI) and serial SCSI (SAS) protocols, according to an interface scheme between the host device 2100 and the SSD 2200.

Figure 10:
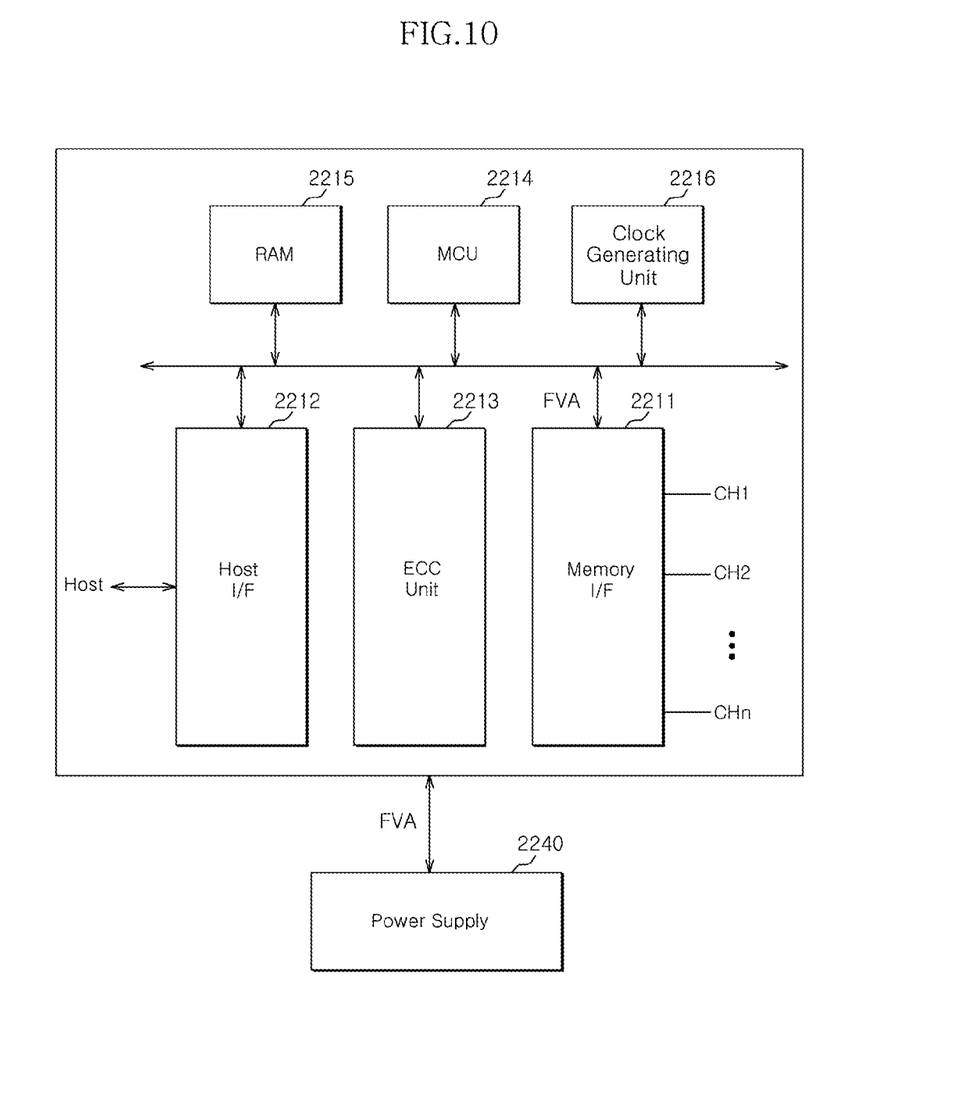
FIG. 10 is a block diagram exemplarily showing the SSD controller shown in FIG. 9.

FIG. 10 is a block diagram exemplarily showing the SSD controller shown in FIG. 9. Referring to FIG. 10, the SSD controller 2210 includes a memory interface 2211, a host interface 2212, an ECC unit 2213, a micro control unit 2214, a RAM 2215, and a clock generating unit 2216.

The memory interface 2211 may be configured to provide a command and an address to the nonvolatile memory devices 2231 to 223n. Moreover, the memory interface 2211 may be configured to exchange data with the nonvolatile memory devices 2231 to 223n. The memory interface 2211 may scatter the data transmitted from the buffer memory device 2220 to the respective channels CH1 to CHn, under the control of the micro control unit 2214. Furthermore, the memory interface 2211 may transfer the data read from the nonvolatile memory devices 2231 to 223n to the buffer memory device 2220, under the control of the micro control unit 2214.

The memory interface 2211 may be configured to generate a control signal FVA for dynamically controlling the operating clock and the operating voltage of the SSD controller 2210 according to operating states of the nonvolatile memory devices 2231 to 223n. For example, the memory interface 2211 may generate the control signal FVA while controlling the read or write operation of at least one of the nonvolatile memory devices 2231 to 223n. In another example, the memory interface 2211 may generate the control signal FVA while controlling data to be transmitted through the channels CH1 to CHn.

The host interface 2212 may be configured to provide an interface with the SSD 2200 in correspondence to the protocol of the host device 2100. For example, the host interface 2212 may be configured to communicate with the host device 2100 through one of parallel advanced technology attachment (PATA), serial advanced technology attachment (SATA), small computer system interface (SCSI) and serial SCSI (SAS) protocols. In addition, the host interface 2212 may perform a disk emulating function of supporting the host device 2100 to recognize the SSD 2200 as a hard disk drive (HDD).

The ECC unit 2213 may be configured to generate parity bits based on the data transmitted to the nonvolatile memory devices 2231 to 223n. The generated parity bits may be stored in spare areas of the nonvolatile memory devices 2231 to 223n. The ECC unit 2213 may be configured to detect an error of the data read from the nonvolatile memory devices 2231 to 223n. When the detected error falls within a correctable range, the ECC unit 2213 may be configured to correct the detected error.

The micro control unit 2214 may be configured to analyze and process a signal SGL inputted from the host device 2100. The micro control unit 2214 may control the general operations of the SSD controller 2210 in response to a request from the host device 2100. The micro control unit 2214 may control the operations of the buffer memory device 2220 and the nonvolatile memory devices 2231 to 223n according to a firmware for driving the SSD 2200. The RAM 2215 may be used as a working memory device for driving the firmware.

The clock generating unit 2216 may be configured to generate a clock to be used in the SSD controller 2210. The clock generated by the clock generating unit 2216 may be used as the operating clock of the function blocks (for example, the memory interface 2211, the host interface 2212, the ECC unit 2213, the micro control unit 2214 and the RAM 2215) included in the SSD controller 2210. The clock generating unit 2216 may change the frequency or the cycle of an output clock according to the control signal FVA which is provided from the memory interface 2211. For example, the clock generating unit 2216 may generate an output clock with a high frequency, that is, an output clock with a short cycle, when the activated control signal FVA is provided. In another example, the clock generating unit 2216 may generate an output clock with a low frequency, that is, an output clock with a long cycle, when the deactivated control signal FVA is provided.

The power supply 2240 may change the level of an output voltage according to the control signal FVA which is provided from the memory interface 2211. For example, the power supply 2240 may generate an output voltage with a high level when the activated control signal FVA is provided. In another example, the power supply 2240 may generate an output voltage with a low level when the deactivated control signal FVA is provided.

Because the operating clock and the operating voltage to be used in the SSD controller 2210 may be dynamically controlled in response to the control signal FVA which is provided from the memory interface 2211, the SSD controller 2210 may reduce power consumption.

Figure 11:
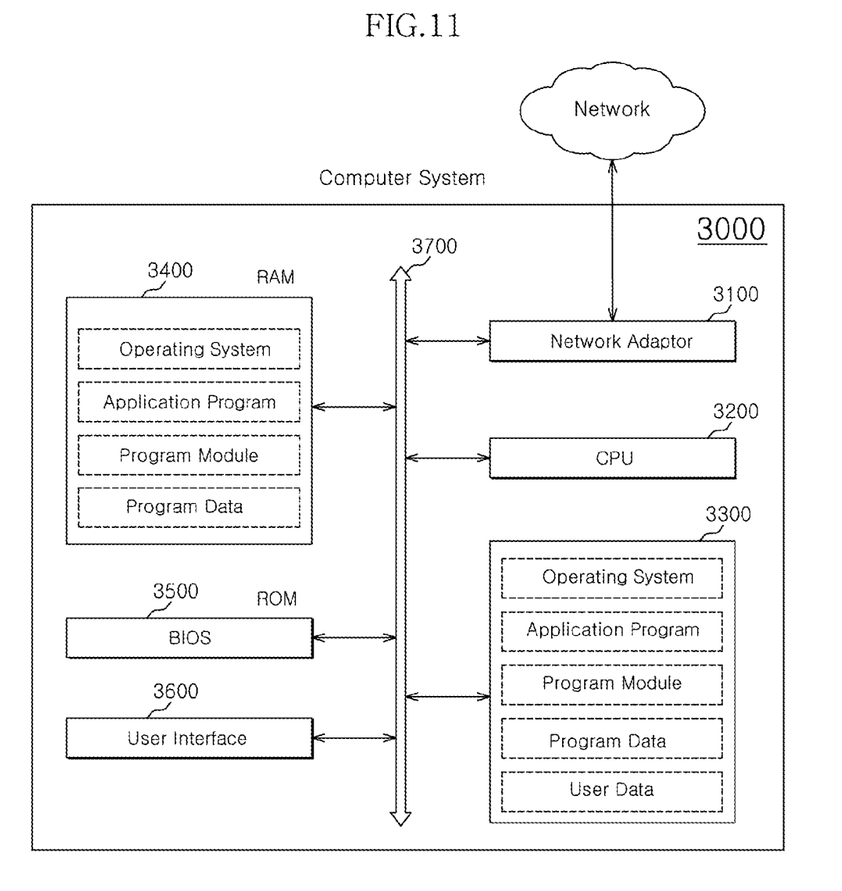
FIG. 11 is a block diagram exemplarily showing a computer system in which a data storage device in accordance with an embodiment of the present disclosure is mounted.

FIG. 11 is a block diagram exemplarily showing a computer system in which a data storage device in accordance with an embodiment of the present disclosure is mounted. Referring to FIG. 11, a computer system 3000 includes a network adaptor 3100, a central processing unit 3200, a data storage device 3300, a RAM 3400, a ROM 3500 and a user interface 3600, which are electrically coupled to a system bus 3700. The data storage device 3300 may be constituted by the data storage device 100 shown in FIG. 1, the data storage device 200 shown in FIG. 6, the data storage device 1200 shown in FIG. 8 or the SSD 2200 shown in FIG. 9.

The network adaptor 3100 provides interfacing between the computer system 3000 and external networks. The central processing unit 3200 performs general operations for driving an operating system residing at the RAM 3400 or an application program.

The data storage device 3300 stores general data necessary in the computer system 3000. For example, an operating system for driving the computer system 3000, an application program, various program modules, program data and user data are stored in the data storage device 3300.

The RAM 3400 may be used as a working memory device of the computer system 3000. Upon booting, the operating system, the application program, the various program modules and the program data necessary for driving programs, which are read from the data storage device 3300, are loaded on the RAM 3400. A basic input/output system (BIOS) which is activated before the operating system is driven is stored in the ROM 3500. Information exchange between the computer system 3000 and a user is implemented through the user interface 3600.

Although not shown in a drawing, it is to be readily understood that the computer system 3000 may further include devices such as an application chipset, a camera image processor (CIS), and so forth.

While certain embodiments have been described above, it will be understood to those skilled in the art that the embodiments described are by way of example only. Accordingly, the data storage device described herein should not be limited based on the described embodiments. Rather, the data storage device described herein should only be limited in light of the claims that follow when taken in conjunction with the above description and accompanying drawings.

What is claimed is:

1. A data storage device comprising:
    a nonvolatile memory device; and
    a controller including a memory interface configured to provide control signals to the nonvolatile memory device, electrically coupled with the nonvolatile memory device via a channel for transmitting the control signals and data, and configured to control an operation of the nonvolatile memory device, and including a micro-control unit,
    wherein the controller is configured to change a frequency of an internal clock and a level of an internal voltage if data is to be transmitted through the channel, and
    wherein the memory interface provides a frequency voltage control signal to the micro-control unit, a clock generator and a power supply.

2. The data storage device according to claim 1, wherein the controller comprises:
    a clock generator configured to generate the internal clock of which cycle is changed according to the frequency voltage control signal; and
    a power supply configured to generate the internal voltage of which level is changed according to the frequency voltage control signal,
    wherein the memory interface is configured to activate or deactivate the frequency voltage control signal.

3. The data storage device according to claim 2, wherein the memory interface is configured to activate the frequency voltage control signal while controlling the nonvolatile memory device such that data is transmitted through the channel, and deactivate the frequency voltage control signal for a remaining period.

4. The data storage device according to claim 3, wherein the clock generator is configured to generate a clock with a first frequency according to the activated frequency voltage control signal, and generate the clock with a second frequency which has a cycle longer than a cycle of the first frequency, according to the deactivated frequency voltage control signal.

5. The data storage device according to claim 4, wherein the controller is configured to operate at a high speed according to the clock with the first frequency.

6. The data storage device according to claim 4, wherein the controller is configured to operate at a low speed according to the clock with the second frequency.

7. The data storage device according to claim 4, wherein the clock generator comprises:
    a clock generation block configured to generate any one of the clock with the first frequency and the clock with the second frequency; and
    a clock frequency control block configured to control the clock generation block according to the frequency voltage control signal.

8. The data storage device according to claim 3, wherein the power supply is configured to generate a first internal voltage according to the activated frequency voltage control signal, and generate a second internal voltage which has a level lower than a level of the first internal voltage, according to the deactivated frequency voltage control signal.

9. The data storage device according to claim 8, wherein the controller is configured to operate at a high speed according to the first internal voltage.

10. The data storage device according to claim 8, wherein the controller is configured to operate at a low speed according to the second internal voltage.

11. The data storage device according to claim 8, wherein the power supply comprises:
    a voltage generation block configured to generate any one of the first internal voltage and the second internal voltage; and
    a voltage level control block configured to control the voltage generation block according to the frequency voltage control signal.

12. A data storage device comprising:
    a nonvolatile memory device; and
    a controller including a memory interface configured to provide control signals to the nonvolatile memory device, electrically coupled with the nonvolatile memory device via a channel for transmitting the control signals and data, and configured to control an operation of the nonvolatile memory device, and including a micro-control unit,
    wherein the controller is configured to operate at any one of a low speed mode and a high speed mode according to whether or not data is to be transmitted through the channel, and
    wherein the memory interface provides a frequency voltage control signal to the micro-control unit, a clock generator and a power supply.

13. The data storage device according to claim 12, wherein the controller is configured to change a frequency of an internal clock and a level of an internal voltage necessary for the controller to operate at any one of the low speed mode and the high speed mode.

14. The data storage device according to claim 13, wherein the controller is configured to operate at the high speed mode while the nonvolatile memory device performs a read or write operation.

15. The data storage device according to claim 14, wherein the controller is configured to operate at the high speed mode while data is transmitted from the nonvolatile memory device or data is transmitted to the nonvolatile memory device.

16. The data storage device according to claim 14, wherein the controller is configured to increase the frequency of the internal clock and raise the level of the internal voltage, to operate at the high speed mode.

17. The data storage device according to claim 13, wherein the controller is configured to operate at the low speed mode while the nonvolatile memory device performs an operation other than a read or write operation.

18. The data storage device according to claim 17, wherein the controller is configured to decrease the frequency of the internal clock and reduce the level of the internal voltage, to operate at the low speed mode.

19. The data storage device according to claim 17, wherein the controller is configured to operate at the low speed mode while data is not transmitted from the nonvolatile memory device or data is not transmitted to the nonvolatile memory device.

* * * * *